US008774424B2

(12) United States Patent
Fletcher

(10) Patent No.: US 8,774,424 B2
(45) Date of Patent: Jul. 8, 2014

(54) APPARATUS FOR REPRODUCTION OF SOUND

(75) Inventor: Stuart Fletcher, Torguay (GB)

(73) Assignee: Airsound LLP, Torquay Devon (GB)

( * ) Notice: Subject to any disclaimer, the term of this patent is extended or adjusted under 35 U.S.C. 154(b) by 0 days.

(21) Appl. No.: 13/130,480

(22) PCT Filed: Nov. 18, 2009

(86) PCT No.: PCT/GB2009/051562

§ 371 (c)(1), (2), (4) Date: Jun. 15, 2011

(87) PCT Pub. No.: WO2010/058211

PCT Pub. Date: May 27, 2010

(65) Prior Publication Data

US 2011/0249857 A1 Oct. 13, 2011

(30) Foreign Application Priority Data

Nov. 21, 2008 (GB) .................................. 0821327.4

(51) Int. Cl.

*H04R 1/40* (2006.01)
*H04R 1/02* (2006.01)
*H03G 5/00* (2006.01)
*H04R 5/02* (2006.01)

(52) U.S. Cl.

USPC .................. 381/97; 381/87; 381/89; 381/98; 381/99; 381/304

(58) Field of Classification Search

USPC .............. 381/182, 87, 89, 97–100, 119–120, 381/300, 303–304, 332–336

See application file for complete search history.

(56) References Cited

U.S. PATENT DOCUMENTS

| | | | | |
|---|---|---|---|---|
| 2,544,742 | A * | 3/1951 | Volf | 181/145 |
| 4,335,274 | A | 6/1982 | Ayers | |
| 4,418,243 | A * | 11/1983 | Fixler | 381/308 |
| 4,819,269 | A | 4/1989 | Klayman | |
| 5,117,459 | A | 5/1992 | McShane | |
| 8,175,304 | B1 * | 5/2012 | North | 381/308 |
| 2005/0134374 | A1 * | 6/2005 | Hench et al. | 330/86 |
| 2006/0233402 | A1 | 10/2006 | Inagaki et al. | |
| 2007/0041599 | A1 * | 2/2007 | Gauthier et al. | 381/307 |
| 2009/0134374 | A1 | 5/2009 | Krug | |

FOREIGN PATENT DOCUMENTS

| | | | | |
|---|---|---|---|---|
| DE | 31 42 462 | A1 | 5/1982 | |
| EP | 1 511 353 | A1 | 3/2005 | |
| EP | 1511353 | A1 * | 3/2005 | H04R 5/02 |
| GB | 492 089 | A | 9/1938 | |
| JP | 200387900 | A | 3/2003 | |

* cited by examiner

*Primary Examiner* — Matthew Eason

(74) *Attorney, Agent, or Firm* — Kilpatrick Townsend & Stockton LLP

(57) ABSTRACT

Apparatus for reproducing sound including at least three loudspeakers (5, 6, 7) mounted in a substantially sealed enclosure. The three loudspeakers may be mounted to a wall of the enclosure so that they are all directed away from, and evenly spaced around, a common point. Two speakers may be driven with the respective out of phase signals comprising the difference between two stereo channels and another speaker with the sum of those channels.

16 Claims, 2 Drawing Sheets

APPARATUS FOR REPRODUCTION OF SOUND

CROSS-REFERENCES TO RELATED APPLICATIONS

The present application claims priority to PCT/GB2009/051562 filed Nov. 18, 2009 which claims priority to Great Britain Patent Application No. 0821327.4 filed Nov. 21, 2008 entitled "APPARATUS FOR REPRODUCTION OF SOUND", incorporated by reference for all purposes.

The present invention relates to apparatus for reproduction of sound, particularly stereo sound.

In conventional sound reproduction apparatus comprising a loudspeaker driven by an amplifier it is generally the loudspeaker which introduces the greatest error into the reproduced sound, especially in lower cost mass market equipment. There are particular issues where reproduction of low audio frequencies (for example below 120 Hz) are concerned. One is that of vibration of a loudspeaker enclosure which can be a particular problem with closed box loudspeaker enclosures. In effect, forces generated by the loudspeaker or speakers mounted in an enclosure cause the enclosure to vibrate. This vibration generates secondary sound waves which interfere with those produced by the loudspeaker causing distortion of the reproduced sound.

Embodiments of the present invention have been made in consideration of this problem.

According to the present invention there is provided apparatus for reproducing sound comprising at least three loudspeakers mounted in a substantially sealed enclosure, the loudspeakers being directed away from the enclosure in respective substantially evenly spaced directions.

Thus, when the loudspeakers are driven with the same, or corresponding in phase, signals any forces produced by the speakers on the enclosure will be cancelled out owing to the symmetry of the arrangement. This reduces or eliminates distortion of low frequencies as a result of vibration of the enclosure by the loudspeakers. Use of three or more speakers enables good quality stereo reproduction to be achieved by use of a sum and difference technique.

Whilst there may be three or more than three speakers, only three is preferred.

Each speaker is preferably mounted substantially the same distance from a common point in the enclosure. Each speaker is preferably directed away from the common point in a direction which is angularly spaced from that of adjacent speakers by an angle of substantially 360°/n, where n is the number of speakers.

Each speaker may be directed in a direction extending radially from a common point. The directions in which all speakers are directed may be substantially in the same plane.

The enclosure may be any suitable shape. Preferably it includes a substantially cylindrical wall or substantially spherical wall and the speakers are mounted to the wall. In one arrangement the enclosure is substantially cylindrical with closed ends. Other shapes are of course possible, for example the enclosure could comprise a wall in the shape of a regular polygon having one side for each loudspeaker, for example a triangular wall for a three speaker system, square wall for a four speaker system, pentagonal wall for a five speaker system and so on.

The loudspeakers may be arranged substantially symmetrically.

A drive circuit is preferably provided for driving the loudspeakers. Some or all the components of the drive circuit may be mounted on or in the enclosure. Other components of the circuit may be provided separately to the enclosure.

The drive circuit is preferably arranged to enable the loudspeakers to be driven with a two channel stereo audio signal.

Preferably the drive circuit is arranged to drive each loudspeaker with a signal comprising only in phase low frequency components of the sum of the two channels. To this end the drive circuit may include a low pass filter. The low pass filter may attenuate frequencies higher than a specific frequency in the range 120 Hz to 200 Hz. Driving all the speakers in phase with low frequency signals minimises vibration of the enclosure and consequent distortion of the reproduced sound.

Preferably, the drive circuit is arranged to drive two loudspeakers with respective out of phase signals comprising the difference of the two channels. More preferably the two speakers are driven with respective out of phase signals comprising only high frequency components of the difference of the two channels. To this end drive circuit may include a high pass filter. The high pass filter may attenuate frequencies below a specific frequency in the range 200 Hz to 120 Hz. The drive circuit is also preferably arranged to drive another loudspeaker with a signal comprising the sum of the two channels. Reproducing out of phase (preferably substantially 180° out of phase) signals comprising the difference of two channels together with reproduction of the sum of the two signals enables a reproduction of stereo sound field using sum and difference technique.

Preferably the drive circuit includes an amplifier for driving a loudspeaker. The amplifier is arranged to produce an electrical output signal for driving one or more loudspeakers, wherein the current of the output signal is substantially proportional to the voltage of an input electrical signal to the amplifier. The amplifier may be a power amplifier and an individual amplifier may be provided for each loudspeaker. The or each power amplifier may be comprised in a negative feedback loop.

In order that the invention may be more clearly understood embodiments thereof will now be described, by way of example, with reference to the accompanying drawings of which:

Figure 1:
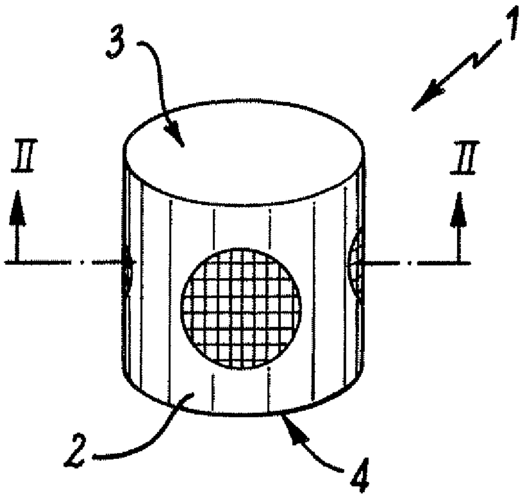
FIG. 1 is a perspective view of apparatus according to the invention.
Figure 2:
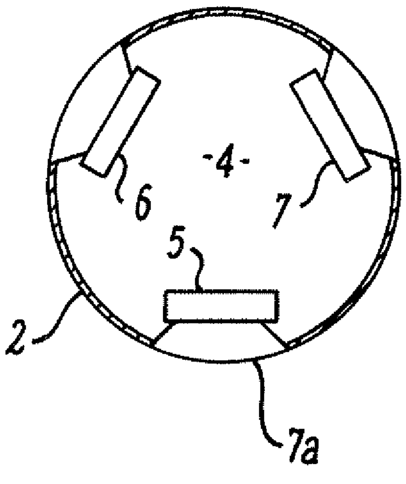
FIG. 2 is a cross-sectional view of the apparatus of FIG. 1 taken along line II-II.

Referring to the drawings the apparatus comprises a substantially cylindrical enclosure, generally 1, closed at opposite ends. The enclosure has a substantially cylindrical wall 2 and substantially flat end walls forming a top 3 and base 4. The enclosure may be formed of any suitable material, for example wood and plastics materials.

Three substantially circular apertures are formed in the sidewall 2 of the enclosure. The apertures are formed approximately midway between the top and bottom of the enclosure 1 and are evenly spaced around its circumference. Three loudspeakers 5,6 and 7 are mounted respectively to the three apertures. Each loudspeaker is conventional in design and comprises a driver arranged to drive a generally frustroconical diaphragm. Each speaker is mounted to the housing such that the environment in the housing is substantially sealed from that outside the housing. Each loudspeaker is covered by a respective grille 7*a* which forms an extension of the cylindrical wall 2.

The three loudspeakers are directed in three respective radial directions spaced apart by substantially 120°.

Other forms of enclosure could be employed. For example the enclosure could comprise a substantially spherical wall and the three speakers could be mounted to the wall, directed in three respective radial directions lying substantially in a common plane and spaced apart by substantially 120°.

A driving circuit is provided to enable the speakers to be driven by a two channel stereo audio signal, comprising left and right channel signals. The driving circuit or, some elements of the driving circuit, could be provided in the enclosure or separately.

Figure 3:
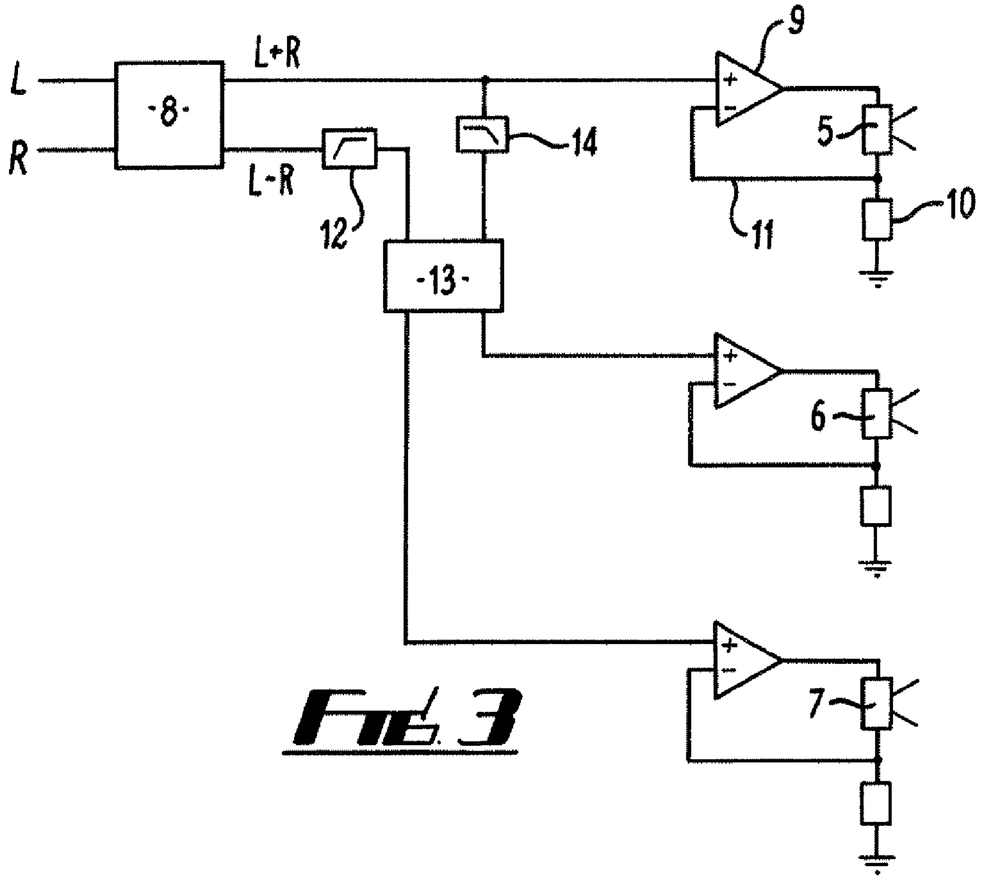
FIG. 3 is a block circuit diagram of the drive circuit of the apparatus of FIG. 1.

An embodiment of the driving circuit is shown in FIG. 3. Referring to the figures, left L and right R channels of a two channel stereo audio signal are fed to a sum and difference matrix 8 arranged to provide sum L+R and difference L−R signals.

The L+R signal is fed to an amplifier 9 arranged to drive loudspeaker 5. The loudspeaker 5 is connected between the output of the amplifier and ground, in series. A ballast resistor 10 is connected in series between the loudspeaker and ground and a negative feedback line II runs from between the loudspeaker 5 and ballast resistor 10 to the negative input of the amplifier 9. The amplifier is therefore included in a negative feedback loop, the ballast resistor 10 forming a potential divider with the loudspeaker 1 such that a negative feedback signal is generated in line 11 which is proportional to the current flowing through the loudspeaker and ballast resistor. As a result, the output current from the power amplifier is directly proportional to the voltage of the driving (L+R) signal.

The driver of the loudspeaker comprises an electrical conductor in the form of a coil which passes through a magnetic field. Physical forces acting on the conductor (such as due to its inertial resistance as a result of its mass) will modify the instantaneous impedance of the conductor. Any change in impedance of the conductor will, however, via the feedback connection, cause the amplifier to correct its output to maintain a constant or substantially constant output current, for a given input voltage. The result is an amplifier and loudspeaker combination that minimises the distorting influence of its own physical construction.

In addition as the loudspeaker is mounted in a substantially sealed housing the diaphragm of the loudspeaker is acoustically coupled to the air in the surrounding listening environment outside the housing and this results in physical forces acting on the conductor of the loudspeaker driver. In particular, variations in acoustic pressure on the loudspeaker diaphragm will cause proportional variations in the dynamic impedance of the conductor. Again, though, the negative feedback provided to the amplifier 9 will result in the amplifier modifying its output voltage to maintain a substantially constant current flowing through the loudspeaker. In effect the output of the amplifier adaptively adjusts to make the sound pressure in the air proportional to the input voltage to the amplifier. In this way both the amplifier and loudspeaker are effectively included in the feedback loop, and the quality and fidelity of sound reproduction is improved over conventional arrangements. In practice it is found that this provides extended and lower distortion bass frequencies, extended high frequencies and improved linearity of amplitude frequency response.

The difference L−R signal produced by the sum and difference matrix is fed via a high pass filter 12 to a second sum and difference matrix 13. The sum L+R signal is also fed to the second sum and difference matrix 13, but in this case via a low pass filter 14. The high pass filter is arranged to exclude frequencies below about 120 Hz, and the low pass filter to exclude frequencies above about 120 Hz.

The sum of the low frequency components of L+R and the high frequency components of L−R is employed to drive loudspeaker 6 which is directed to the left hand side of loudspeaker 5 when the apparatus is viewed from the direction in which loudspeaker 5 faces. Loudspeaker 6 is driven by an amplifier arrangement the same as that used to drive loudspeaker 5.

The difference between the low frequency components of L+R and the high frequency components of L−R is employed to drive loudspeaker 7 which is directed to the right hand side of loudspeaker 5 when the apparatus is viewed from the direction in which loudspeaker 5 faces. Loudspeaker 7 is driven by an amplifier arrangement the same as that used to drive loudspeakers 5 and 6.

In effect, the components of the difference L−R signal driving loudspeakers 6 and 7 are substantially 180° out of phase with each other.

The apparatus reproduces a stereo sound field to a listener positioned generally in the direction that loudspeaker 5 faces, using the principles of the sum and difference system of reproducing two channel stereo audio by broadcasting a sum signal and modifying this by broadcasting generally oppositely directed out of phase difference signals. However the apparatus confers a number of significant advantages over existing loudspeaker arrangements.

The use of current controlled amplifiers confers the advantages discussed above, which are particularly felt because the loudspeakers are mounted in a sealed housing. These advantages are of greatest value where reproduction of audio frequencies is concerned.

The physical arrangement of the loudspeakers, each loudspeaker being spaced by a substantially equal distance from a central point and the directions in which the three speakers face being equally spaced about the central point, coupled with the fact that the three loudspeakers are all driven in phase at low frequencies, ensures that vibrational forces which might otherwise cause vibration of the housing are substantially cancelled out. Thus distortion of reproduced sound as a result of induced vibration of the housing is substantially eliminated. The inherent rigidity of a cylindrical (or spherical) housing also helps to minimise vibration.

Although the loudspeakers are not all driven in phase at higher frequencies, these frequencies are much less likely to cause vibration of the housing. Given typical speaker sizes and the range of high frequency audio, the mass of the enclosure is likely to eliminate any significant audio frequency distortions.

Figure 4:
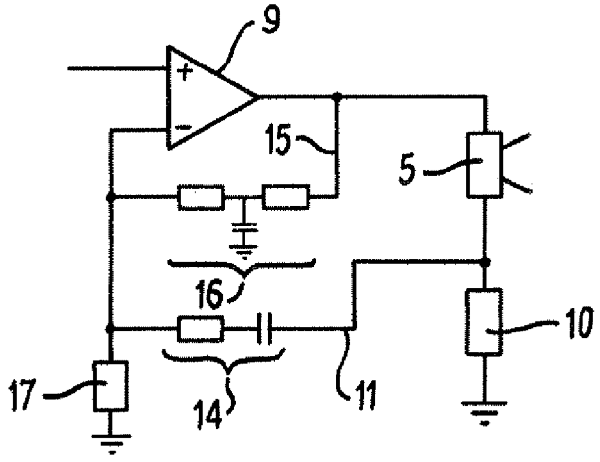
FIG. 4 is a block circuit diagram of an alternative amplifier configuration of the apparatus of FIG. 1.

FIG. 4 shows an alternative implementation for the feed back circuit for driving each speaker. Here a high pass filter 14 is included in the feedback line 11 and a conventional feedback line 15, incorporating a low pass filter 16 is also provided. The negative input of the amplifier 9 is also connected to earth via a resistor 17. The effect of this arrangement is to increase the proportion of current feedback at high frequencies and decreases the proportion of current feedback, in favour of conventional voltage feedback, at low frequencies to guard against damage to the driven loudspeaker due to excessive excursions of its driver.

Other changes to the driving circuit are possible as will be apparent to a person of ordinary skill in the art, For example the amplifier of the described embodiments may be power amplifiers or they may be replaced by a combination of pre and power amplifiers.

The above embodiments are described by way of example. Many variations are possible without departing from the invention as defined by the appended claims.

The invention claimed is:

1. Apparatus for reproducing sound comprising at least three loudspeakers mounted in a substantially sealed enclosure, the loudspeakers being directed away from the enclosure in respective substantially evenly spaced directions, the apparatus further comprising a drive arranged to enable the loudspeakers to be driven with a two channel stereo audio signal, wherein the drive is arranged to drive all loudspeakers with a signal comprising in phase low frequency components of the sum of the two channels and to drive two of the loudspeakers with respective out of phase signals comprising the difference of the two channels, wherein the directions in which all the speakers are directed are substantially in the same plane.

2. Apparatus as claimed in claim 1 wherein each speaker is mounted substantially the same distance from a common point in the enclosure.

3. Apparatus as claimed in claim 2 wherein each speaker is directed away from the common point in a direction which is angularly spaced from that of adjacent speakers by an angle of substantially 360°/n where n is the number of speakers.

4. Apparatus as claimed in claim 1 wherein each speaker is directed in a direction extending radially from a common point.

5. Apparatus as claimed in claim 1 wherein the enclosure includes a substantially cylindrical wall or substantially spherical wall and the speakers are mounted to the wall.

6. Apparatus as claimed in claim 5 wherein the enclosure is substantially cylindrical with closed ends.

7. Apparatus as claimed in claim 1 wherein the enclosure comprises a wall substantially in the shape of a regular polygon.

8. Apparatus as claimed in claim 1 wherein the loudspeakers are arranged substantially symmetrically.

9. Apparatus as claimed in claim 1 wherein the drive includes a low pass filter operative to attenuate frequencies higher than a specific frequency in the range 120 Hz to 200 Hz, from the drive signal used to drive each loudspeaker.

10. Apparatus as claimed in claim 1 wherein the two speakers are driven with respective out of phase signals comprising high frequency components of the difference of the two channels.

11. Apparatus as claimed in claim 10 wherein the drive includes a high pass filter operative to attenuate frequencies below a specific frequency in the range 200 Hz to 120 Hz from the out of phase drive signals.

12. Apparatus as claimed in claim 11 wherein the drive is arranged to drive another loudspeaker with a signal comprising the sum of the two channels.

13. Apparatus as claimed in claim 1 wherein the drive includes an amplifier arranged to produce an electrical output signal for driving one or more loudspeakers, wherein the current of the output signal is substantially proportional to the voltage of an input electrical signal to the amplifier.

14. Apparatus as claimed in claim 13 wherein the amplifier is comprised in a negative feedback loop.

15. Apparatus as claimed in claim 1, wherein one of the loudspeakers is driven by a signal that is unfiltered.

16. Apparatus as claimed in claim 1, wherein the enclosure is a single undivided enclosure.

* * * * *

UNITED STATES PATENT AND TRADEMARK OFFICE

CERTIFICATE OF CORRECTION

PATENT NO. : 8,774,424 B2
APPLICATION NO. : 13/130480
DATED : July 8, 2014
INVENTOR(S) : Edward Stuart Fletcher It is certified that error appears in the above-identified patent and that said Letters Patent is hereby corrected as shown below:

On the Title Page: Item 75

Please change the name of inventor from “Stuart Fletcher” to “Edward Stuart Fletcher”.

Please change the address of inventor from “Torguay (GB)” to “Torquay (GB)”.

Signed and Sealed this
Twenty-third Day of June, 2015

Michelle K. Lee
*Director of the United States Patent and Trademark Office*